United States Patent
Onodera et al.

(10) Patent No.: US 8,723,193 B2
(45) Date of Patent: May 13, 2014

(54) MULTI-LAYER WIRING SUBSTRATE, ACTIVE MATRIX SUBSTRATE, IMAGE DISPLAY APPARATUS USING THE SAME, AND MULTI-LAYER WIRING SUBSTRATE MANUFACTURING METHOD

(75) Inventors: Atsushi Onodera, Tokyo (JP); Koei Suzuki, Kanagawa (JP); Hiroshi Miura, Kanagawa (JP); Takanori Tano, Chiba (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/613,938

(22) Filed: Sep. 13, 2012

(65) Prior Publication Data
US 2013/0069087 A1 Mar. 21, 2013

(30) Foreign Application Priority Data

Sep. 16, 2011 (JP) ................................. 2011-203294

(51) Int. Cl.
*H01L 33/00* (2010.01)
(52) U.S. Cl.
USPC .................. 257/88; 349/43; 257/71; 257/79; 257/40; 427/108; 427/58; 427/226; 438/640
(58) Field of Classification Search
USPC ................... 349/43; 257/71, 79, 40; 438/640; 427/58, 108, 226
See application file for complete search history.

(56) References Cited

U.S. PATENT DOCUMENTS

| 4,828,587 | A  | * | 5/1989 | Baurmeister et al. ................ 96/6 |
| 7,060,320 | B1 | * | 6/2006 | Omote et al. ................. 427/108 |
| 2003/0193624 | A1 |   | 10/2003 | Kobayashi et al. |
| 2004/0238816 | A1 | * | 12/2004 | Tano et al. ....................... 257/40 |
| 2004/0266207 | A1 |   | 12/2004 | Sirringhauss et al. |
| 2006/0038953 | A1 | * | 2/2006 | Moriya ......................... 349/144 |
| 2006/0170836 | A1 | * | 8/2006 | Kondo et al. .................... 349/43 |
| 2006/0222855 | A1 | * | 10/2006 | Yasuda ...................... 428/411.1 |
| 2006/0222859 | A1 | * | 10/2006 | Yasuda et al. ................. 428/413 |
| 2006/0252260 | A1 | * | 11/2006 | Yamazaki et al. ............ 438/640 |
| 2007/0023911 | A1 | * | 2/2007 | Moriyama .................... 257/750 |

(Continued)

FOREIGN PATENT DOCUMENTS

| JP | 2004-004733 | 1/2004 |
| JP | 2005-500558 | 1/2005 |

(Continued)

OTHER PUBLICATIONS

Radiation emitting products, U.S.Food and Drug Administration.*

*Primary Examiner* — Bac Au
*Assistant Examiner* — Sophia Nguyen
(74) *Attorney, Agent, or Firm* — Cooper & Dunham LLP

(57) ABSTRACT

A multiple-layer wiring substrate having a first conductive layer; an interlayer insulating layer; and a second conductive layer is disclosed, wherein the interlayer insulating layer includes a material whose surface energy is changed by receiving energy, and has a first region which does not include a contact hole and a second region which is formed such that its surface energy is higher than that of the first region, wherein a region within the contact hole of the first conductive layer has surface energy which is higher than surface energy of the second region of the interlayer insulating layer, and wherein the second conductive layer is formed by laminating, wherein the second conductive layer is in contact with the second region of the interlayer insulating layer along the second region, and is connected to the first conductive layer via the contact hole.

12 Claims, 15 Drawing Sheets

(56) References Cited

U.S. PATENT DOCUMENTS

| | | |
|---|---|---|
| 2008/0029766 A1* | 2/2008 | Onodera et al. ............... 257/71 |
| 2008/0311285 A1 | 12/2008 | Hirai et al. |
| 2009/0071701 A1 | 3/2009 | Onodera et al. |
| 2009/0095958 A1 | 4/2009 | Inoue et al. |
| 2009/0103036 A1 | 4/2009 | Onodera et al. |
| 2009/0278138 A1* | 11/2009 | Suzuki et al. ................. 257/79 |
| 2009/0280245 A1* | 11/2009 | Krebs et al. ................... 427/226 |
| 2009/0321727 A1 | 12/2009 | Yutani et al. |
| 2010/0181571 A1 | 7/2010 | Tano et al. |
| 2010/0321357 A1* | 12/2010 | Zhang et al. ................. 345/207 |
| 2011/0215336 A1* | 9/2011 | Onodera et al. ............... 257/71 |
| 2011/0261332 A1* | 10/2011 | Cortie et al. ................... 355/30 |
| 2011/0266549 A1 | 11/2011 | Onodera et al. |
| 2012/0097639 A1* | 4/2012 | Mitsudome .................... 216/37 |
| 2012/0178017 A1* | 7/2012 | Murai et al. ................... 429/482 |

FOREIGN PATENT DOCUMENTS

| | | |
|---|---|---|
| JP | 2005-250055 | 9/2005 |
| JP | 2006-215462 | 8/2006 |
| JP | 2009-021552 | 1/2009 |
| JP | 2010-153883 | 7/2010 |

* cited by examiner

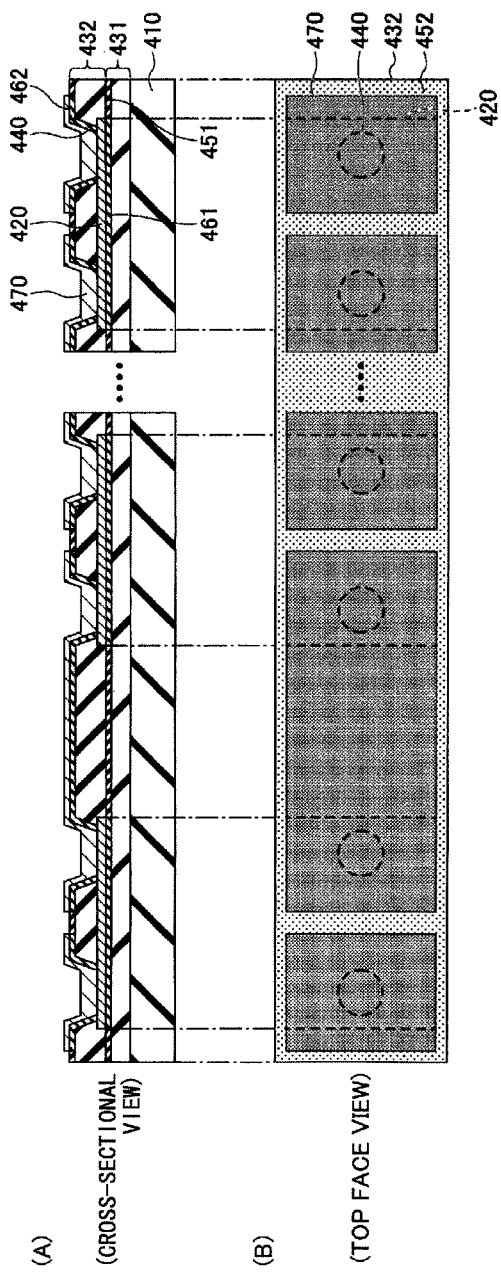

MULTI-LAYER WIRING SUBSTRATE, ACTIVE MATRIX SUBSTRATE, IMAGE DISPLAY APPARATUS USING THE SAME, AND MULTI-LAYER WIRING SUBSTRATE MANUFACTURING METHOD

TECHNICAL FIELD

The present invention generally relates to multi-layer wiring substrates, active matrix substrates, image display apparatuses which use the same, and multi-layer wiring substrate manufacturing methods, and particularly relates to multi-layer wiring substrates having a structure in which a first conductive layer and a second conductive layer are electrically connected via a contact hole formed in an interlayer insulating layer, active matrix substrates, an image display apparatus which uses the same, and multi-layer wiring substrate manufacturing methods.

BACKGROUND ART

An inkjet method which supplies a functional liquid containing a conductive material to a predetermined position on a substrate by a required amount is known (see Patent Documents 1 and 2, for example) as a related art method of forming a wiring pattern used in an electronic circuit, etc. The inkjet method has advantages that, compared to a photolithography method using an exposing apparatus, expensive apparatuses or facilities are not needed, the number of processes is smaller, and an efficiency of utilizing a material is higher. In particular, when a multi-layer wiring substrate having multiple wiring layers and an electronic element using the same are manufactured, it is necessary to electrically connect upper and lower wiring layers through a contact hole formed in an insulating layer which separates upper and lower wiring layers. The inkjet method may be applied to filling in such a contact hole or to the process of forming upper and lower wirings.

For example, in a method disclosed in Patent Document 1, a lyophobic area is formed on a region for forming a contact hole on a lower layer wiring in advance and then applying an insulating layer forming material to form a contact hole, the lyophobic area is removed by irradiating light, and then a second wiring is formed by an applying method.

Moreover, in a method disclosed in Patent Document 2, a surface modifying layer which is made of a hydrophobic material is patterned on an insulating layer, and a solution which can dissolve the insulating layer is applied by inkjet to dissolve a part of the insulating layer that is not covered with the surface modifying layer to form a contact hole and further fill the contact hole with the applying method.

However, with the above-described method disclosed in Patent Document 1, there is a problem that, while a diameter of the contact hole may be adjusted by changing an ejecting amount of lyophobic liquid droplets in the process of forming the lyophobic area, an applying method is used, so that there is a lower limit to a size of the contact hole. For example, with the inkjet method, control of not more than 1 pl (pico liter) of liquid droplets is difficult and further a functional solution for forming the lyophobic area undergoes wet spreading on the substrate. Moreover, when multiple nozzles are used, a variation in an impact position of the functional solution occurs among nozzles. Due to these reasons, it is difficult to form the contact hole of a size of less than or equal to 50 micrometers, for example. Moreover, the second wiring is also formed by the applying method, so that it is similarly difficult to accurately fill the contact hole with a conductive functional liquid, or to micro fabricate a second wiring layer.

Furthermore, with the method disclosed in the above-described Patent Document 2, the surface modifying layer which is made of the hydrophobic material is patterned on the insulating layer with a laser, etc., making it possible to form a fine contact hole which is specified with a laser beam diameter. However, there is a problem that, as the conductive material is applied on the hydrophobic material when the contact hole is filled to form an upper wiring layer, a shape of an upper wiring is disturbed, making it difficult to obtain a fine upper wiring.

PATENT DOCUMENTS

Patent Document 1: JP2009-21552A
Patent Document 2: Japanese translation No. 2005-500558 of PCT application publication

DISCLOSURE OF THE INVENTION

Thus, an object of the present invention is to provide a multi-layer wiring substrate which may electrically connect, via a fine contact hole, fine upper and lower wiring layers with superior shape control properties; an active matrix substrate; an image display apparatus which uses the same; and a multi-layer wiring substrate manufacturing method.

According to an embodiment of the present invention, a multiple-layer wiring substrate having a first conductive layer formed on the substrate; an interlayer insulating layer formed on the first conductive layer; and a second conductive layer formed on the interlayer insulating layer, and having a structure in which the first conductive layer and the second conductive layer are electrically connected via a contact hole formed in the interlayer insulating layer is provided, wherein the interlayer insulating layer includes a material whose surface energy is changed by receiving energy, and has a first region which does not include the contact hole and a second region which is formed such that its surface energy is higher than that of the first region, wherein a region within the contact hole of the first conductive layer has surface energy which is higher than surface energy of the second region of the interlayer insulating layer, and wherein the second conductive layer is formed by laminating, wherein the second conductive layer is in contact with the second region of the interlayer insulating layer along the second region, and is connected to the first conductive layer via the contact hole.

The present invention makes it possible to electrically connect, via a fine contact hole, fine upper and lower wiring layers with superior shape control properties.

BRIEF DESCRIPTION OF THE DRAWINGS

Other objects, features, and advantages of the present invention will become more apparent from the following detailed descriptions when read in conjunction with the accompanying drawings, in which:

FIG. 13 is a set of views illustrating an exemplary multi-layer wiring substrate according to an Example 1 of the present invention, with (A) being a cross-sectional view of the exemplary multi-layer wiring substrate according to the Example 1 and (B) being a top face view of the exemplary multi-layer wiring substrate according to the Example 1.

BEST MODE FOR CARRYING OUT THE INVENTION

Below, embodiments for carrying out the present invention are described with reference to the drawings. In the respective drawings, the same letters are applied to the same elements, so that duplicate explanations may be omitted.

(Embodiment 1)

Figure 1:
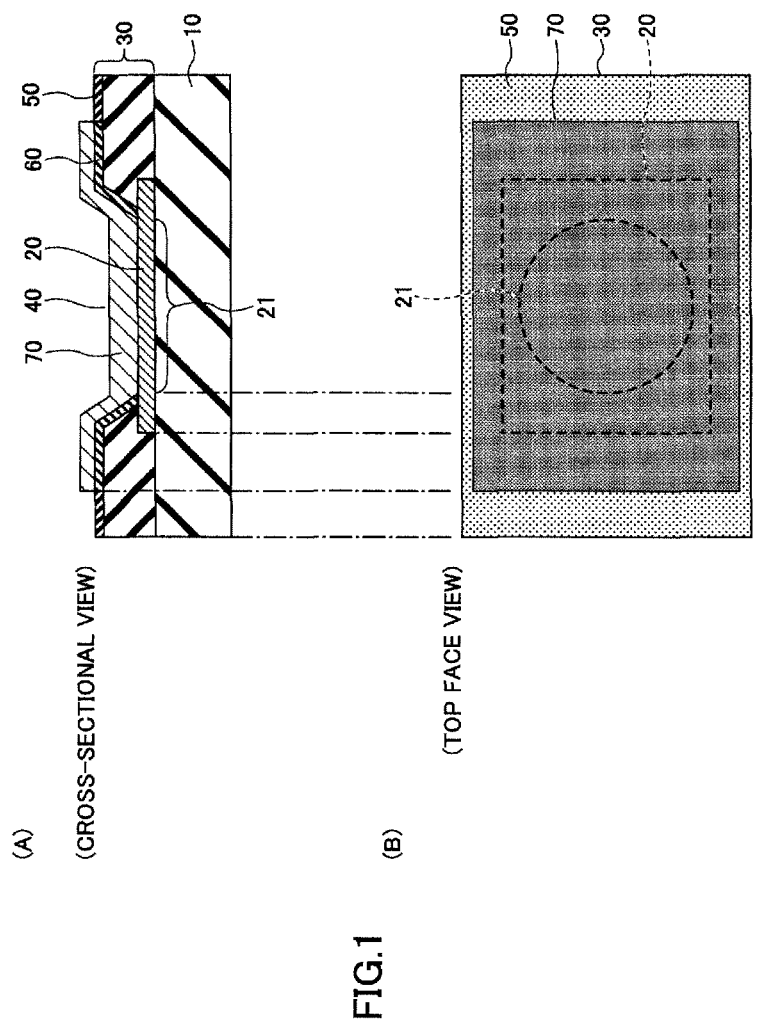
FIG. 1 is a set of views illustrating an exemplary multi-layer wiring substrate according to an Embodiment 1 of the present invention, with (A) being a cross-sectional view of the exemplary multi-layer wiring substrate according to the Embodiment 1 and (B) being a top face view of the exemplary multi-layer wiring substrate according to the Embodiment 1.

FIG. 1 is a set of views illustrating an exemplary multi-layer wiring substrate according to an Embodiment 1 of the present invention, with (A) being a cross-sectional view of the exemplary multi-layer wiring substrate according to the Embodiment 1 and (B) being a top face view of the exemplary multi-layer wiring substrate according to the Embodiment 1. First, an overview structure of the multi-layer wiring substrate according to the Embodiment 1 is described using FIG. 1.

In (A) and (B) in FIG. 1, the multi-layer wiring substrate according to the Embodiment 1 includes a substrate 10; a first conductive layer 20; an interlayer insulating layer 30; a contact hole 40; and a second conductive layer 70. Moreover, the interlayer insulating layer 30 includes a low surface energy region 50 and a high surface energy region 60. The first conductive layer 20 is formed on the substrate 10 and the interlayer insulating layer 30 is formed on the first conductive layer 20. Moreover, the contact hole 40 is formed in the interlayer insulating layer 30 such that a part of the first conductive layer 20 exposes, and the second conductive layer 70 is formed on the contact hole 40. The second conductive layer 70 is formed by a continuous deposition on a flat portion of the interlayer insulating layer 30 in which the high surface energy region 60 is formed, on the inside face of the contact hole 40, and on a region in which the first conductive layer 20 exposes. The flat portion of the interlayer insulating layer 30 in which the second conductive layer 70 is formed and the inside face of the contact hole 40 match the high surface energy region 60 of the interlayer insulating layer 30. Then, there is a structure in which the first conductive layer 20 and the second conductive layer 70 are electrically connected via the contact hole 40.

Various types may be used for the substrate 10, which is a base material to be a base for forming the multi-layer wiring structure on a surface thereof. As the substrate 10, a glass substrate, a silicon substrate, a stainless substrate, a film substrate, etc., may be used, for example. As the film substrate, a polyimide (PI) substrate, a polyether sulfone (PES) substrate, a polyethyleneterephtalate (PET) substrate, a polyethylenenaphtalate (PEN) substrate, etc., may be used, for example.

The first conductive layer 20 is a conductive wiring layer which is formed on the substrate 10. While the first conductive layer 20 is directly formed on a surface of the substrate 10 in FIG. 1, it may be indirectly formed on a different layer such as an insulating layer, etc., on the substrate 10. For the first conductive layer 20, materials including metal raw materials made of a transparent conductor, etc., such as indium oxide, zinc oxide, tin oxide, gallium oxide, etc., Au, Ag, Cu, Pt, Al, Ni, Pd, Pb, In, Sn, Zn, TI, or alloys thereof, a material including a conductive polymer in which PEDOT (poly(3,4-ethylenedioxythiophene)) is doped with PSS (poly(styrenesulfonate)) and doped PANI (polyaniline) may be used.

The interlayer insulating layer 30 is stacked on the first conductive layer 20. With a formation of the contact hole 40 into the interlayer insulating layer 30, a part of the first conductive layer 20 is exposed. Such an exposed portion becomes a region within the contact hole 40, and may be called a contact hole region 21. In (B) in FIG. 2, an example is shown in which the contact hole region 21 is provided in a center region of the first conducting layer 20.

The interlayer insulating layer 30 is a layer for insulating the first conductive layer 20 and a wiring layer thereover. In the interlayer insulating layer 30 is formed the contact hole 40, via which the first conductive layer 20 and the wiring layer thereover are arranged to be electrically connected. In FIG. 1, the first conductive layer 20 and the second conductive layer 70 are electrically connected via the contact hole 40.

The interlayer insulating layer 30 includes a material whose surface energy changes due to deposition of energy. Then, with the deposition of the energy, the interlayer insulating layer 30 is divided into regions with different surface energy states. More specifically, it is divided into the low surface energy region 50 which does not include the contact hole 40, and the high surface energy region 60 with surface energy which is higher than that of the low surface energy region 50.

More specifically, the interlayer insulating layer 30 includes a wetting property-changing material whose surface energy (critical surface tension) is changed by receiving energy such as heat, electron beam, ultraviolet rays, plasma, etc. As this wetting property changing material, a polymer material may be used which has a hydrophobic group in a side chain. More specifically, as the polymer material, a side chain having a hydrophobic group that is linked directly or via a linking group to a main chain having backbones such as polyimide, (meta) acrylate, etc., is used. It is believed that, by receiving energy, side chain cleavage occurs, surface energy of the interlayer insulating layer 30 increases, and wetting property improves. As the hydrophobic group, a hydrocarbon group which does not include a fluorine atom and a fluoroalkyl group does include the fluorine atom may be used.

In the interlayer insulating layer 30 are formed a low surface energy region 50 which does not include the contact hole 40 and which includes a flat part; and a high surface energy region 60 of the interlayer insulating layer 30 whose surface energy is higher relative to the first region 50 and which includes at least the inside face of the contact hole 40.

The second conductive layer 70 is a conductive layer for electrically connecting the first conductive layer, and a wiring layer which is the same layer as the second conductive layer 70. The second conductive layer 70 is deposited along the high surface energy region 60 such that it is in contact with the high surface energy region 60 of the interlayer insulating layer 30 and is connected with the first conductive layer 20 via the contact hole 40. For the second conductive layer 70, in a manner similar to the first conductive layer 20, materials including metal raw materials made of a transparent conductor, etc., such as indium oxide, zinc oxide, tin oxide, gallium oxide, etc. Au, Ag, Cu, Pt, Al, Ni, Pd, Pb, In, Sn, Zn, TI, or alloys thereof, a material including a conductive polymer in which PEDOT (poly(3,4-ethylenedioxythiophene)) is doped with PSS (poly(styrenesulfonate)) and doped PANT (polyaniline) may be used.

In the multi-layer wiring substrate according to the present embodiment, the surface energy of the first conductive layer 20 is arranged to be higher than the surface energy of the high surface energy region 60 of the interlayer insulating layer 30. In order to arrange the surface energy of the first conductive layer 20 to be higher than that of the high surface energy region of the interlayer insulating layer 30, a surface energy difference of a material may be used or the first conductive layer 20 may be processed such that the surface energy of the first conductive layer 20 becomes high. For example, an energy beam such as a laser light, etc., may be irradiated onto the surface of the first conductive layer 20 to increase the surface energy of the first conductive layer 20. With such a configuration, the second conductive layer 70 is formed with a larger thickness with bottom up properties, making it easier to take an electrical connection between the second conductive layer 70 and the first conductive layer 20.

Moreover, in the multi-layer wiring substrate according to the present embodiment, a side face of the contact hole 40, which is formed in the interlayer insulating layer 30, preferably has a forward tapered shape. In this way, compared to a case of the contact hole 40 having a vertical inside face or a case of the contact hole 40 having a reverse tapered inside face, it is made easier for the second conductive layer 70 to be shaped with a certain film thickness even for the inside face of the contact hole 40.

Moreover, in the multi-layer wiring substrate according to the present embodiment, it is preferable that a film thickness of the second conductive layer 70 at a center portion of a region within the contact hole 40 is larger than a film thickness of the second conductive layer 70 on the inside face of the contact hole. In this way, the bottom up properties of the second conductive layer 70 may be increased, so that it may be made easier to take an electrical connection between the second conductive layer 70 and the first conductive layer 20.

(Embodiment 2)

Figure 2:
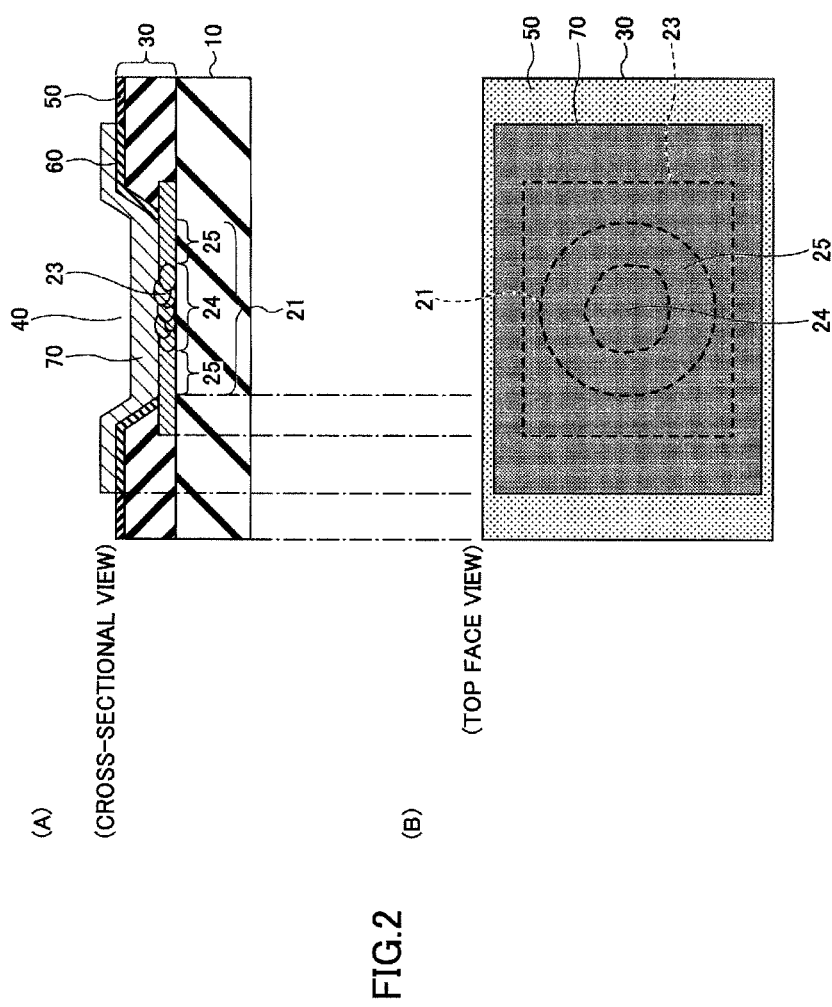
FIG. 2 is a set of views illustrating an exemplary multi-layer wiring substrate according to an Embodiment 2 of the present invention, with (A) being a cross-sectional view of the exemplary multi-layer wiring substrate according to the Embodiment 2 and (B) being a top face view of the exemplary multi-layer wiring substrate according to the Embodiment 2.

FIG. 2 is a set of views illustrating an exemplary multi-layer wiring substrate according to an embodiment 2 of the present invention, with (A) being a cross-sectional view of the exemplary multi-layer wiring substrate according to the Embodiment 2 and (B) being a top face view of the exemplary multi-layer wiring substrate according to the Embodiment 2. In (A) and (B) in FIG. 2, the same reference letters are applied to the same elements as those of the multi-layer wiring substrate according to the Embodiment 1, so that explanations thereof are omitted.

In (A) and (B) in FIG. 2, in the same manner as the multi-layer wiring substrate in the Embodiment 1, in the multi-layer wiring substrate according to the Embodiment 2, a first conductive layer 22 is formed on a substrate 10, an interlayer insulating layer 30 is formed on the first conductive layer 22, the contact hole 40 is formed in the interlayer insulating layer 30 with a part of the first conductive layer 22 exposing from the interlayer insulating layer 30 to be a contact hole region 21, and the second conductive layer 70 is formed such that it covers an exposing portion (the contact hole region 21) of the first conductive layer 22. Moreover, in the some manner as the Embodiment 1, the surface of the interlayer insulating layer 30 is divided into a low surface energy region 50 which does not include the contact hole 40; and a high surface energy region 60 with the surface energy higher than that of the low surface energy region 50, and the second conductive layer 70 is formed on the high surface energy region 60.

The multi-layer wiring substrate according to the Embodiment 2 differs from the multi-layer wiring substrate according to the Embodiment 1 in that multiple crystal grains 23 and a crystal grain boundary are included in the contact hole region 21 of the first conductive layer 22. The crystal grains 23 and the crystal grain boundary are formed within the contact hole region 21. At least one of surface roughness and grain diameter in a central portion 24 of the contact hole region 21 is preferably larger than the surface roughness or the grain diameter in the vicinity 25 of an end portion of the contact hole region 21. The larger the surface roughness or the grain diameter the larger an area of contact with the second conductive layer 70, making it possible to increase adhesion. The adhesion of the central portion 24 in the contact hole 40 may be increased to make it easier to take an electrical connection between the second conductive layer 70 and the first conductive layer 22, making it possible to ensure the electrical connection between the second conductive layer 70 and the first conductive layer 22.

The crystal grains 23 and the grain boundary of the first conductive layer 22 may be formed with various methods; for example, a laser light may be irradiated onto the first conductive layer 22 to form the crystal grains 23 and the grain boundary. Then, laser light energy can be set such that a central portion of laser light energy distribution in the diameter direction is highest as in normal distribution and it becomes lower in a peripheral portion thereof relative to the central portion thereof to form a large crystal grain 23 with processing of the central portion being conducted merely by irradiating laser light onto the contact hole region 21 of the first conductive layer 22 to conduct the processing.

In this way, with the multi-layer wiring substrate according to the Embodiment 2, the first conductive layer 22 is arranged to have crystal grains 23 and a grain boundary in the contact hole region 21 and to make surface roughness or grain diameter in the central portion 24 larger than that in the vicinity 25 of the end portion, making it possible to increase adhesion in the central portion 24 of the contact hole region 21 with the first conductive layer 22 and the second conductive layer 70 and to make it easier to make an electrical connection between the first conductive layer 22 and the second conductive layer 70.

(Embodiment 3)

Figure 3:
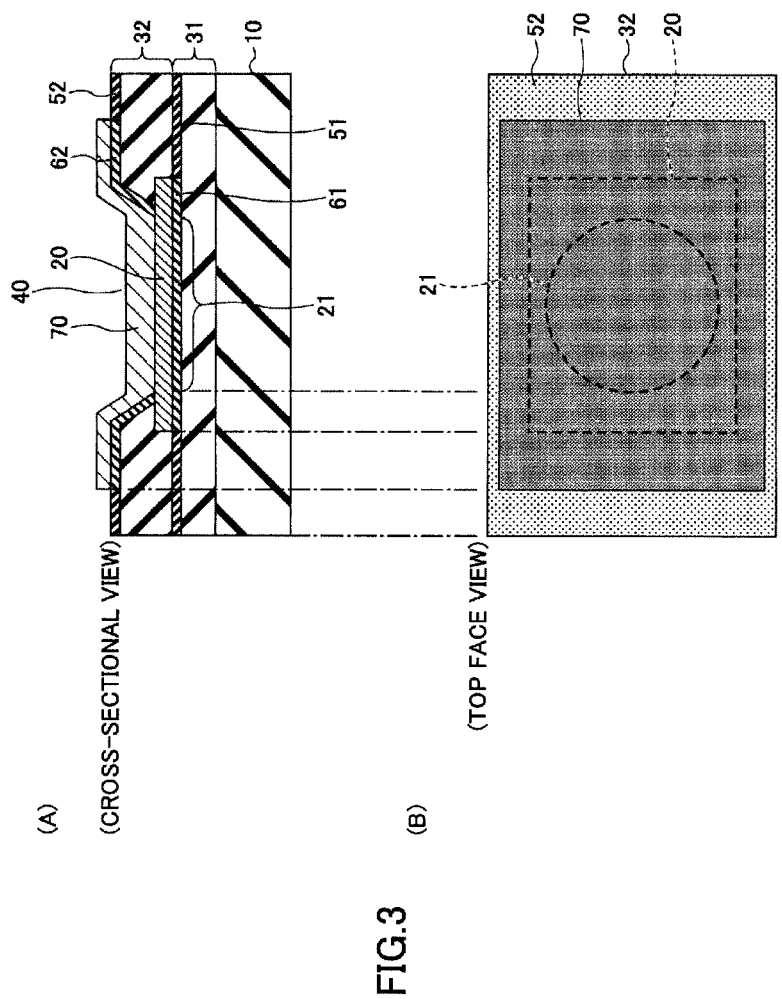
FIG. 3 is a set of views illustrating an exemplary multi-layer wiring substrate according to an Embodiment 3 of the present invention, with (A) being a cross-sectional view of the multi-layer wiring substrate according to the Embodiment 3 and (B) being a top face view of the multi-layer wiring substrate according to the Embodiment 3.

FIG. 3 is a set of views illustrating an exemplary multi-layer wiring substrate according to an Embodiment 3 of the present invention, with (A) being a cross-sectional view of the exemplary multi-layer wiring substrate according to the Embodiment 3 and (B) being a top face view of the exemplary multi-layer wiring substrate according to the Embodiment 3. In the Embodiment 3, the same reference letters are applied to elements which are the same in the Embodiments 1 and 2, so that explanations thereof are omitted.

In (A) and (B) in FIG. 3, in the multi-layer wiring substrate in the Embodiment 3, a first conductive layer 20 is not directly formed on a substrate 10, an insulating layer 31 is directly formed on the substrate 10, and the first conductive layer 20 is formed on the substrate 10 on the insulating layer 31, so that it differs from the multi-layer wiring substrate according to the Embodiment 1. In this way, the first conductive layer 20 does not have to be directly formed on the substrate 10, and may be indirectly formed on the insulating layer 31 on the substrate 10.

The insulating layer 31 may be arranged to be made of various insulating materials; for example, it may be arranged to include a material whose surface energy is changed by receiving energy. For example, as shown in (A) in FIG. 3, the insulating layer 31 may be divided into regions with differing surface energies that include a low surface energy region 51 and a high surface energy region 61, and the first conductive layer 20 being formed selectively on a high surface energy region 41 of the insulating layer 31. In this way, the first conductive layer 20 may be formed in a predetermined region on the insulating layer 31.

In the multi-layer wiring substrate according to the Embodiment 3, a configuration above the first conductive layer 20 is similar to that of the multi-layer wiring substrate according to the Embodiment 1. More specifically, as with the multi-layer wiring substrate according to the Embodiment 1, the interlayer insulating layer 32 is formed on the first conductive layer 20, the contact hole 40 is formed in a part of the interlayer insulating layer 32, a part of the first conductive layer 20 exposed from the interlayer insulating layer 32 to become the contact region 21, and the second conductive layer 70 is formed by deposition such that it covers the flat face (upper face) of the interlayer insulating layer 32, the inside face of the contact hole 40, and the contact hole region 21 of the first conductive layer 20. Moreover, as in the multi-layer wiring substrate according to the Embodiment 1, on the surface of the interlayer insulating layer 32 is formed a low surface energy region 52 with low surface energy that does not include the contact hole 40 and a high surface energy region 62 with surface energy higher than that of the low surface energy region 52 that includes the contact hole 40, and on the high surface energy region 62 is formed the second conductive layer 70.

Furthermore, while only one insulating layer 31 is formed on the substrate 10 in FIG. 3, the multi-layer wiring substrate according to the Embodiment 3 may similarly be arranged even when at least two types of insulating layers are laminate formed and when a wiring layer is inserted between multiple insulating layers.

The multi-layer wiring substrate according to the Embodiment 3 makes it possible to arrange a multi-layer wiring substrate of a wiring structure having the contact hole 90 in an arbitrary layer on the substrate 10.

(Embodiment 4)

Next, a multi-layer substrate manufacturing method according to an Embodiment 4 of the present invention is described using FIGS. 4 to 9. FIGS. 4 to 9 are a set of views illustrating an exemplary multi-layer wiring substrate manufacturing method according to the Embodiment 4. In the multi-layer wiring substrate manufacturing method according to the Embodiment 4, the multi-layer wiring substrate manufacturing method according to the Embodiment 2 is exemplified. Moreover, in the Embodiment 4, the same reference letters are applied to the same elements as those of the multi-layer wiring substrate according to the Embodiment 2, so that explanations thereof are omitted.

Figure 4:
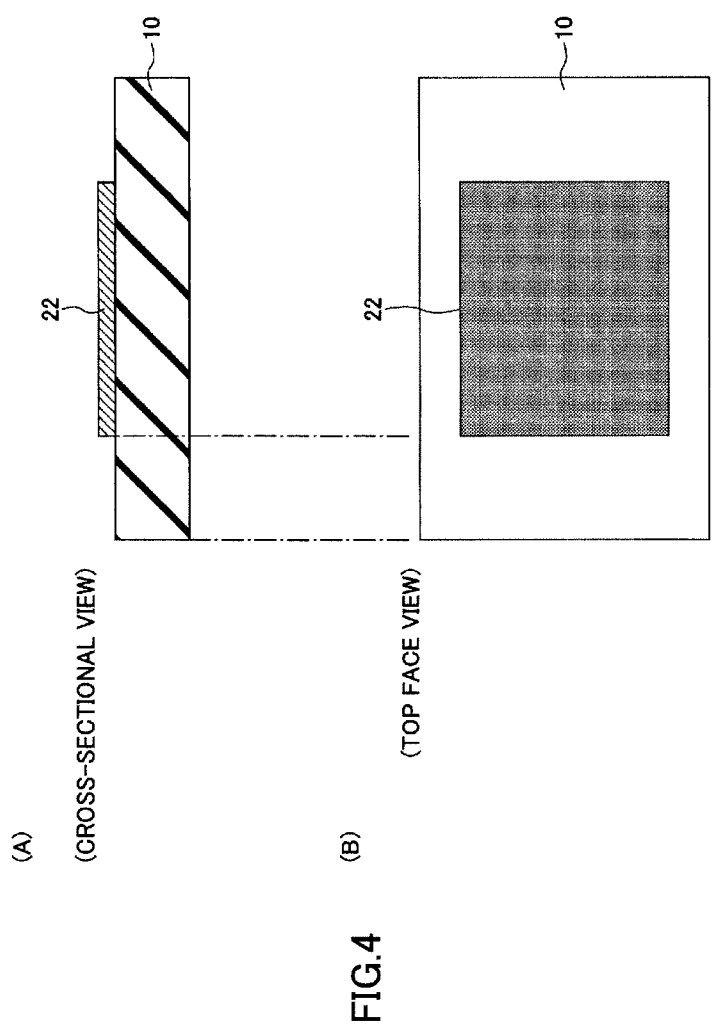
FIG. 4 is a set of views illustrating a first conductive layer forming process of a multi-layer wiring substrate a manufacturing method according to an Embodiment 4, with (A) being a cross-sectional view of the multi-layer wiring substrate in the first conductive layer forming process and (B) being a top face view of the multi-layer wiring substrate in the first conductive layer forming process.

FIG. 4 is a set of views illustrating an exemplary first conductive layer forming process of the multi-layer wiring substrate manufacturing method according to the Embodiment 4. (A) in FIG. 4 is a cross-sectional view of the multi-layer wiring substrate in the first conductive layer forming process, while (B) in FIG. 4 is a top face view of the multi-layer wiring substrate in the first conductive layer forming process.

In the first conductive layer forming process, the first conductive layer 22 is formed on the surface of the substrate 10. The first conductive layer 22 may be formed on the surface of the substrate 10 with various methods; for example, the first conductive layer 22 may be formed on the substrate 10 using patterning means, etc., which combines vacuum film forming, lithography, and etching methods, or various printing methods.

Figure 5:
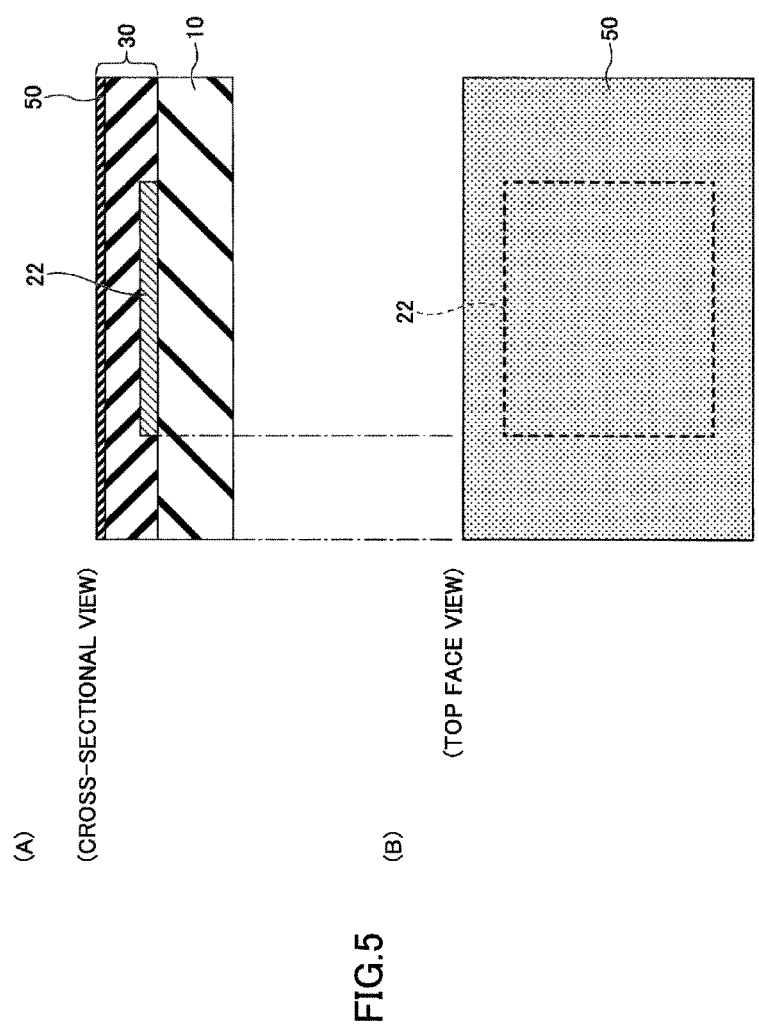
FIG. 5 is a set of views illustrating an exemplary interlayer insulating layer forming process of the multi-layer wiring substrate manufacturing method according to the Embodiment 4, with (A) being a cross-sectional view of a multi-layer wiring substrate in the interlayer insulating layer forming process and (B) being a top face view of the multi-layer wiring substrate in the interlayer insulating layer forming process.

FIG. 5 is a set of views illustrating an exemplary interlayer insulating layer forming process of the multi-layer wiring substrate manufacturing method according to the Embodiment 4. (A) in FIG. 5 is a cross-sectional view of the multi-layer wiring substrate in the interlayer insulating layer forming process, while (B) in FIG. 5 is an upper face view of the multi-layer wiring substrate in the interlayer insulating layer forming process.

In the interlayer insulating layer forming process, a solution which includes the above-described wetting property changing material is applied onto the substrate 10 and the first conductive layer 22 by spin coating, etc., the solution is solidified by drying, and the interlayer insulating layer 30 is formed on the first conductive layer 22. For example, when a polymer material with a structure with a side chain having a hydrophobic group is used, the interlayer insulating layer 30 having the low surface energy region 50 is formed. The low surface energy region 50, which is a region with a low wetting property, has a hydrophobic or water repelling property.

Figure 6:
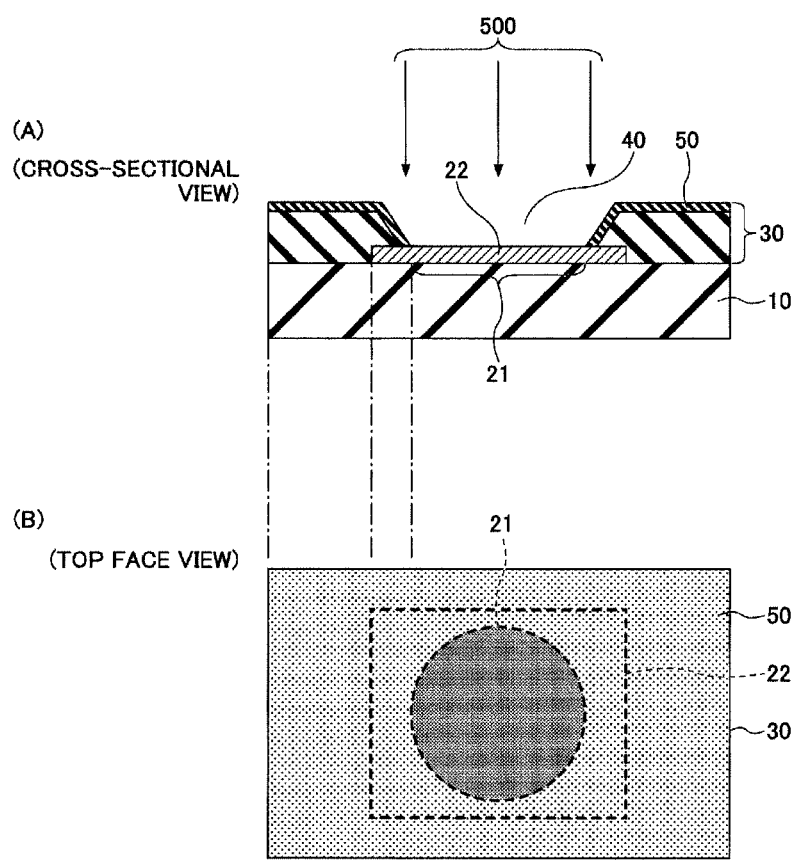
FIG. 6 is a set of views illustrating an exemplary contact hole forming process of the multi-layer wiring substrate manufacturing method according to the Embodiment 4, with (A) being a cross-sectional view of the multi-layer wiring substrate in the contact hole forming process and (B) being a top face view of the multi-layer wiring substrate in the contact hole forming process.

FIG. 6 is a set of views illustrating an exemplary contact hole forming process of the multi-layer wiring substrate manufacturing method according to the Embodiment 4, with (A) being a cross-sectional view of the multi-layer wiring substrate in the contact hole forming process and (B) being a top face view of the multi-layer wiring substrate in the contact hole forming process.

In the contact hole forming process, a laser light 500 is irradiated at a predetermined location of the interlayer insulating layer 30, a part of the interlayer insulating layer 30 is removed, and a contact hole 40 is formed such that a part of the first conductive layer 20 is exposed. In laser processing in the contact hole forming process, a laser processing apparatus which is equipped with an excimerlaser, which is a gas laser; a YAG laser or a YVO4 laser, which is a solid-state laser, may be used. The laser light is irradiated onto the interlayer insulating layer 30 either directly, via a shielding such as a mask, or via collimating with a lens, etc. The laser processing may be used to form the contact hole 40 with a desired size at a predetermined position of the interlayer insulating layer 30. Here, the laser light 500 has a certain intensity distribution such as a Gaussian distribution; in general, the laser intensity (or the laser energy) is strong in the central portion of irradiation and weak in the vicinity of the periphery of irradiation. The processing conditions may be adjusted so as to use such an intensity distribution of the laser light, making it possible to make the side face of the contact hole 40 a forward tapered shape.

Moreover, an irradiating intensity of the laser light may be increased to heat the first conductive layer 22 to facilitate dissolving and solidifying of the first conductive layer 22. In the process of dissolving and solidifying, re-crystallizing of the first conductive layer 22 occurs and the crystal grain diameter increases. Therefore, as shown in (A) in FIG. 2, compared to the first conductive layer 22 in the vicinity 25 of the contact hole end portion, surface roughness of the first conductive layer 22 of the contact hole central portion 24 or the grain diameter thereof may be made greater.

In this way, in the contact hole forming process, while, with laser processing, a part of the interlayer insulating layer 30 may be removed to form the contact hole 40, energy distribution of the irradiated laser light 500 in the diameter direction may be adjusted and the central portion may be made higher than the surrounding portion to form the contact hole 40 which has a side face with a forward tapered shape. Moreover, a laser light 500 may continuously be irradiated onto the exposed first conductive layer 22 even after forming the contact hole to dissolve and solidify the first conductive layer 22, form the crystal grain 23 by re-crystallizing, and increase the crystal grain diameter. Then, the intensity distribution of the laser light 500 may be set such that the central portion becomes larger than the surrounding portion in a manner similar to the time of forming the contact hole 40 by processing, to make the surface roughness or the grain diameter of the central portion 24 within the contact hole region 21 within the first conductive layer 22 larger than that in the vicinity 25 of the end portion.

Figure 7:
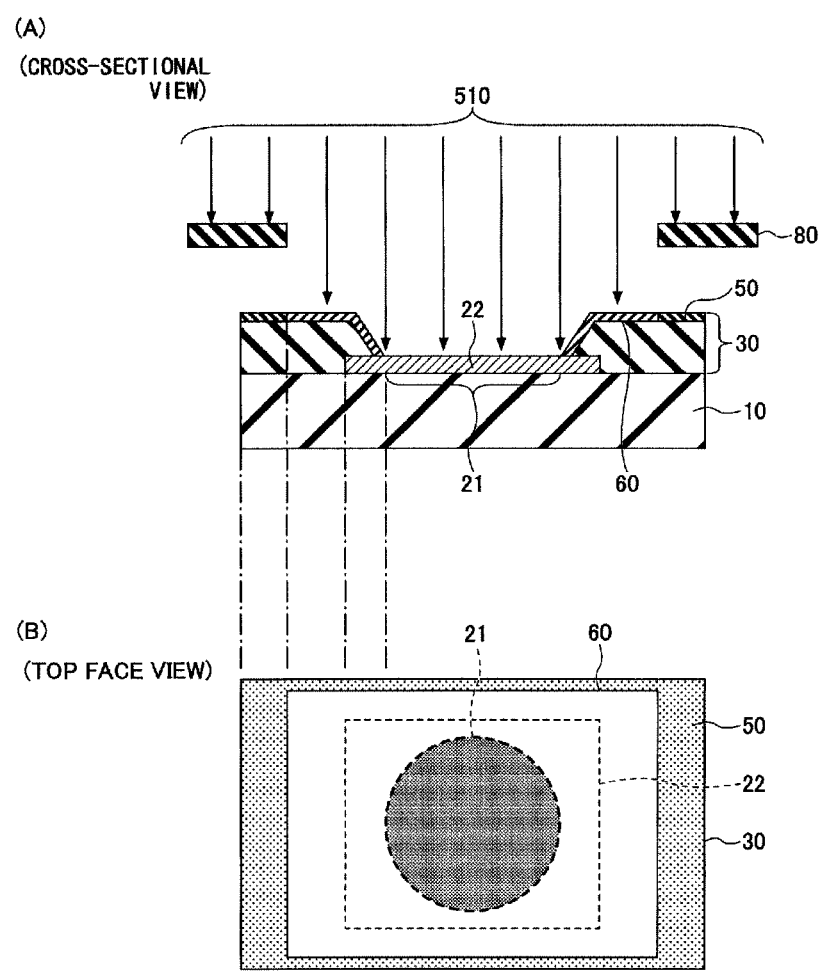
FIG. 7 is a set of views illustrating an interlayer insulating layer modifying process of the manufacturing method of the multi-layer wiring substrate according to the embodiment 4, with (A) being a cross-sectional view of the multi-layer wiring substrate in the interlayer insulating layer modifying process and (B) being a top face view of the multi-layer wiring substrate in the interlayer insulating layer modifying process.

FIG. 7 is a set of views illustrating an exemplary interlayer insulating layer modifying process of the multi-layer wiring substrate manufacturing method according to the embodiment 4. (A) in FIG. 7 is a cross-sectional view of the multi-layer wiring substrate in the interlayer insulating layer modifying process, while (B) in FIG. 7 is a top face view of the multi-layer wiring substrate in the interlayer insulating layer modifying process.

In the interlayer insulating layer modifying process, energy is received at a predetermined location of a surface of the interlayer insulating layer 30 and a portion of the surface of the interlayer insulating layer 30, which is a low surface energy region 50, is modified and changed to a high surface energy region 60. More specifically, in the interlayer insulating layer modifying step, a photo mask 80 is used to expose ultraviolet rays 510 onto a predetermined region including the contact hole 40 on the interlayer insulating layer 30. The portion of the interlayer insulating layer 30 onto which the ultraviolet rays are exposed that has linking of hydrophobic groups cut changes from low surface energy (hydrophobic) to high surface energy (hydrophilic). Thus, the surface of the interlayer insulating layer 30 is divided into regions of different surface energies, which regions include a low surface energy region 50; and a high surface energy region 60 of the interlayer insulating layer 30 whose surface energy is high relative to that of the low surface energy region 50 and which includes at least a side face of the contact hole 40.

Figure 8:
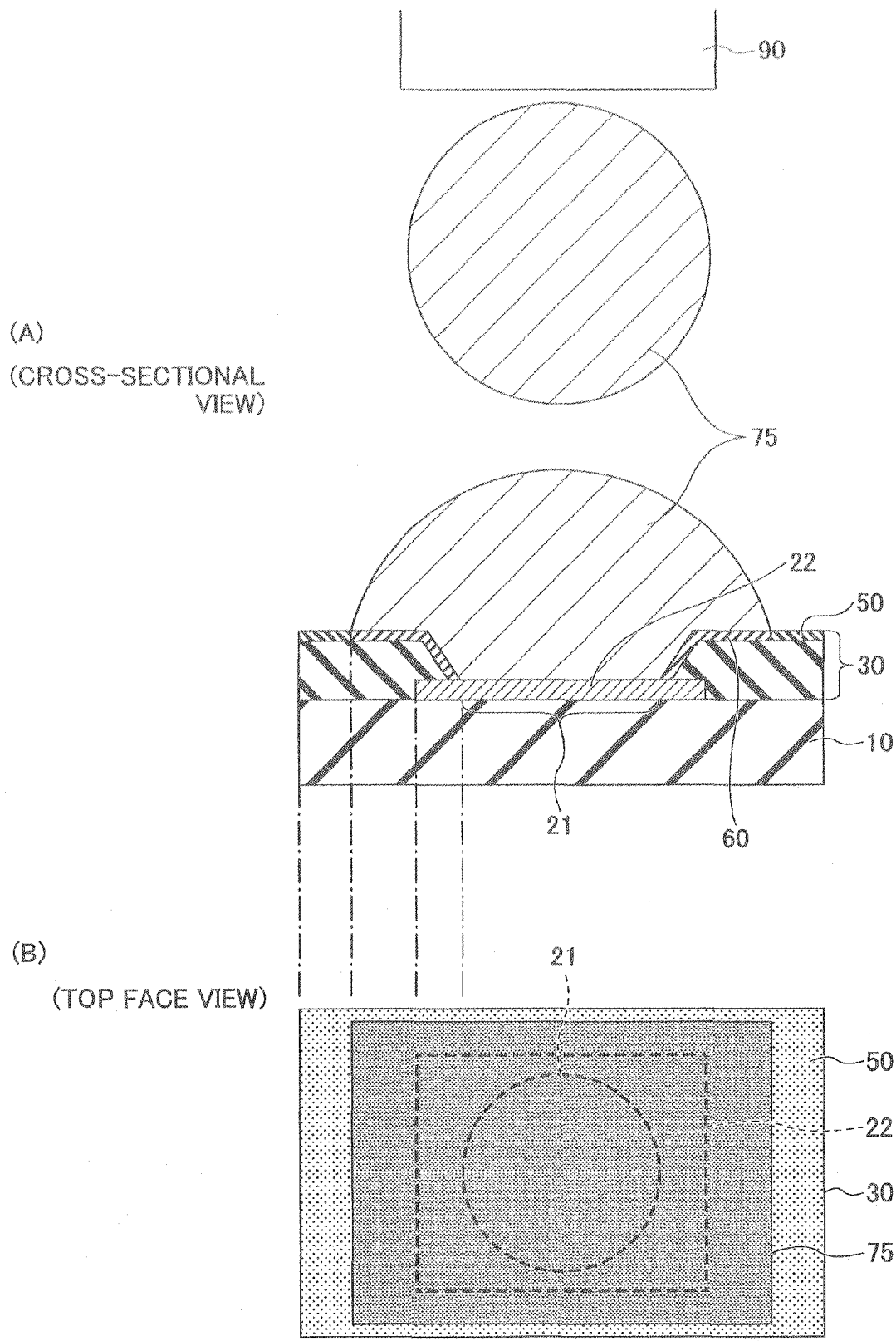
FIG. 8 is a set of views illustrating a functional liquid supplying process in a second conductive layer forming process in the multi-layer wiring substrate manufacturing method according to the Embodiment 4, with (A) being a cross-sectional view of the multi-layer wiring substrate of the functional liquid supplying process in the second conductive layer forming process and (B) being a top face view of the multi-layer wiring substrate of the functional liquid supplying process in the second conductive layer forming process.

FIG. 8 is a set of views illustrating a functional liquid supplying process of a second conductive layer forming process in the multi-layer wiring substrate manufacturing method according to the Embodiment 4, with (A) being a cross-sectional view of the multi-layer wiring substrate of the functional liquid supplying process in the second conductive layer forming process and (B) being a top face view of the multi-layer wiring substrate of the functional liquid supplying process in the second conductive layer forming process.

In the second conductive layer forming process, a functional liquid 75 which includes a conductive material is supplied to a contact hole 40 in the functional liquid supplying process and the functional liquid 75 is dried and solidified in the drying process to form the second conductive layer 70.

In the functional liquid supplying process, the functional liquid 75 including the conductive material is selectively supplied to and arranged in the contact hole 40 and the vicinity thereof from a liquid droplet ejecting nozzle 90. Arrangement means of the functional liquid 75 is preferably an inkjet scheme which has a feature that fine liquid droplets can be accurately dropped one at a time.

For the functional solution 75 including the conductive material, ink in which are dispersed or dissolved, in an organic solvent or water in a form such as a fine grain or a complex, metal raw materials made of a transparent conductor, etc., such as indium oxide, zinc oxide, tin oxide, gallium oxide, etc., Au, Ag, Cu, Pt, Al, Ni, Pd, Pb, In, Sn, Zn, TI, or alloys thereof, an aqueous solution of a conductive polymer in which PEDOT (poly(3,4-ethylenedioxythiophene)) is doped with PSS (poly(styrenesulfonate)) and doped PANI (polyaniline) may be used. In order to use the functional liquid 75 in the inkjet scheme, a surface tension of the functional liquid 75 is preferably between 20 mN/m and 50 mN/m, and a viscosity is preferably between 2 mPa·s and 50 mPa·s.

The functional liquid 75, which is dropped to the contact hole 40 of the interlayer insulating layer 30 and the periphery thereof, undergoes wet spreading on a face to be printed on immediately after coming in contact with the face to be printed on. The low surface energy region 50 of the interlayer insulating layer 30 shows the hydrophobic property to the functional liquid 75 and the high surface energy region 60 of the interlayer insulating layer 30 shows the hydrophilic property to the functional liquid 75, so that the functional liquid 75 selectively flows into the high surface energy region 60. When the difference between the surface energy of the high surface energy region 60 of the interlayer insulating layer 30 and the surface energy of the low surface energy region 50 is large, even when the functional liquid 75 is dropped such that it comes in contact with the low surface energy region 50, a one way like flow of the functional liquid 75 from the low surface energy region 50 to the high surface energy region 60 occurs. Moreover, here the contact hole region 21 of the first conductive layer 22 that exposes within the contact hole 40 of the interlayer insulating layer 30 shows the hydrophilic property to the functional liquid 75 relative to the high surface energy region 60, facilitating the flow of the functional liquid 75 onto the first conductive layer 22 within the contact hole 40. In this way, the functional liquid 75 is selectively supplied onto the first conductive layer 22 within the contact hole 40 and, onto the high surface energy region 60 of the interlayer insulating layer 30. Moreover, conditions may be adjusted to make the film thickness of the second conductive layer 70 in the central portion of the contact hole 40 larger than the film thickness of the second conductive layer 70 on the side face of the contact hole 40.

Figure 9:
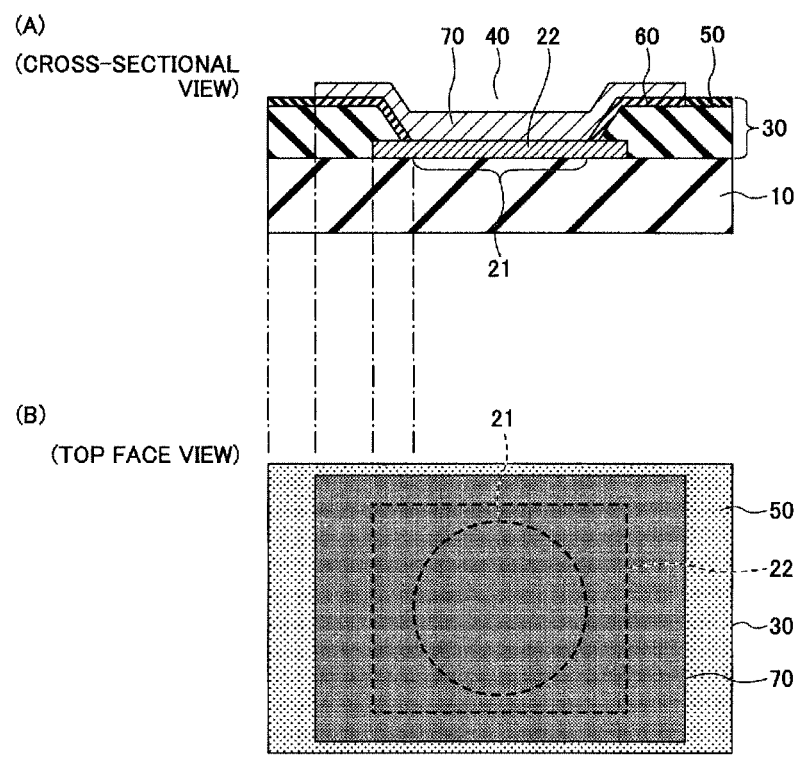
FIG. 9 is a set of views illustrating a drying process in the second conductive layer forming process, with (A) being a cross-sectional view of the multi-layer wiring substrate of the drying process in the second conductive layer forming process and (B) being a top face view of the multi-layer wiring substrate of the drying process in the second conductive layer forming process.

FIG. 9 is a set of views illustrating a drying process in the second conductive layer forming process, with (A) being a cross-sectional view of the multi-layer wiring substrate of the drying process in the second conductive layer forming process and (B) being a top face view of the multi-layer wiring substrate of the drying process in the second conductive layer forming process.

In the drying process, after the functional liquid 75 is supplied to the contact hole 40 in the functional liquid supplying process, the functional liquid 75 is dried and solidified to form the second conductive layer 70. As drying schemes, a convective heat transfer scheme using an oven, etc., a conductive heat transfer scheme using a hot plate, etc., a radiative heat transfer scheme using far infrared rays, microwave, etc. Moreover, drying of the functional liquid 75 does not have to be performed in the atmosphere, but may be performed in an inert gas such as nitrogen or argon, or in a reducing atmosphere including hydrogen gas, or may be arranged to be depressurized as needed. Moreover, a thermal processing, etc., may be added to the dried and solidified second conductive layer 70. In particular, when the above-described nanometal ink is used as the functional liquid 75, it is difficult to realize sufficient conductivity merely by drying and solidifying, requiring a thermal processing, etc., for fusing together the nanoparticles.

Figure 10:
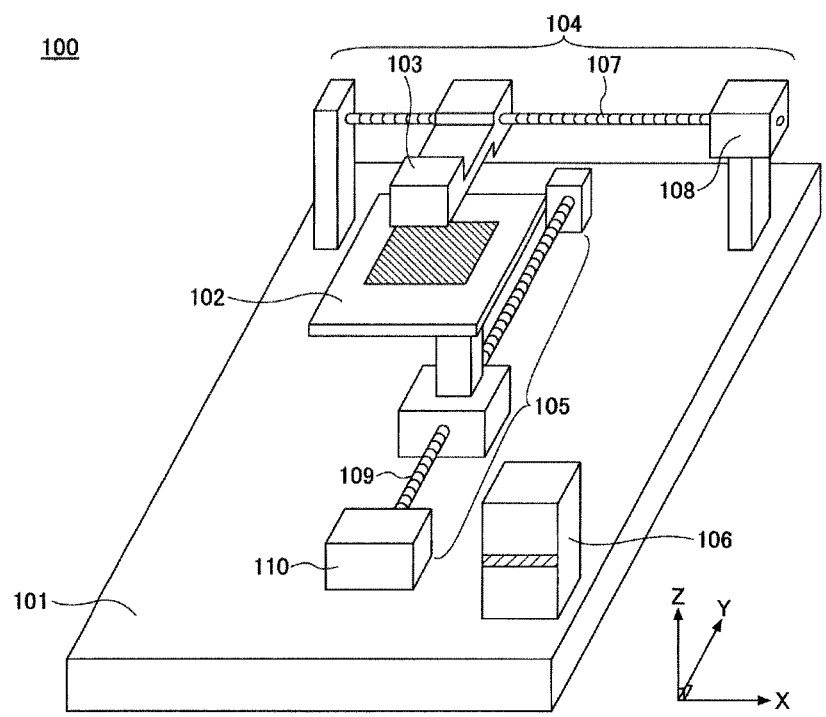
FIG. 10 is a diagram showing an example of an inkjet apparatus used in the second conductive layer process.

FIG. 10 is a diagram showing an example of an inkjet apparatus used in the second conductive layer forming process. An inkjet apparatus 100 includes a surface plate 101; a stage 102; a liquid droplet ejecting head 103; an X-axis direction moving mechanism 104, which is connected to the liquid droplet ejecting head 103; a Y-axis direction moving mechanism 105, which is connected to the stage 102; and a control apparatus 106.

The stage 102, which is provided for the purpose of supporting the substrate 10, is provided with a fixing mechanism such as an adsorbing mechanism (not shown), etc., which adsorbs the substrate 10. Moreover, the stage 102 may be provided with a thermal processing mechanism for drying the functional liquid 75 dropped onto the substrate 10.

The liquid droplet ejecting head 103 is a head having multiple ejecting nozzles 90 (not shown in FIG. 10; see (A) in FIG. 8), which multiple ejecting nozzles 90 are lined up at certain intervals along an X-axis direction on a lower face of the liquid droplet ejecting head 103. The functional liquid 75 is ejected from the ejecting nozzle 90 onto the substrate 10 supported by the stage 102. In the liquid droplet ejecting mechanism of the liquid ejecting head 103, a piezoelectric scheme may be used, for example, in which case a voltage is applied to a piezoelectric element within the liquid droplet ejecting head 103, so that liquid droplets are ejected.

The X-axis direction moving mechanism 104 includes an X-axis direction driving axle 107 and an X-axis direction driving motor 108. In the X-axis direction driving motor 108, which is a stepping motor, etc., a driving signal in the X-axis direction is supplied from the control apparatus 106 to operate the X-axis driving axle 107, so that the liquid droplet ejecting head 103 moves in the X-axis direction.

The Y-axis direction moving mechanism 105 includes a Y-axis direction driving axle 109 and a Y-axis direction driving motor 110. When the driving signal in the Y-axis direction is supplied from the control apparatus 106, the Y-axis direction driving motor 110 rotates the Y-axis driving axle 109, so that the stage 102 moves in the Y-axis direction.

The control apparatus 106 supplies a signal for ejection control to the liquid droplet ejecting head 103. Moreover, the X-axis direction driving signal is supplied to the X-axis direction driving motor 108, while the Y-axis direction driving signal is supplied to the Y-axis direction driving motor 110. The control apparatus 106 is connected via a wiring (not shown) with the liquid droplet ejecting head 103, the X-axis direction driving motor 108, and the Y-axis direction driving motor 110.

The inkjet apparatus 100 ejects liquid droplets of the functional liquid 75 onto the substrate 10 fixed onto the stage 102 while operating the liquid droplet ejecting head 103 and the stage 102. A rotating mechanism which operates independently from the X-axis direction moving mechanism 104 may be provided between the liquid droplet ejecting head 103 and the X-axis direction moving mechanism 104. The rotating mechanism may be operated to change the relative angle between the liquid droplet ejecting head 103 and the stage 102 to adjust a pitch between ejecting nozzles. Moreover, a Z-axis direction moving mechanism which operates independently from the X-axis direction moving mechanism 104 may be provided between the liquid droplet ejecting head 103 and the X-axis direction moving mechanism 104. The liquid droplet ejecting head 103 can be moved in the Z-axis direction to arbitrarily adjust the distance between the substrate 10 and the nozzle face. Moreover, a rotating mechanism which operates independently from the Y-axis direction moving mechanism 105 may be provided between the stage 102 and the Y-axis direction moving mechanism 105. The rotating mechanism may be operated to eject liquid droplets onto the substrate 10 while rotating the substrate 10 fixed onto the stage 102 at an arbitrary angle. In the second conductive layer forming process described in FIGS. 8 and 9, the second conductive layer 70 may be formed by an inkjet scheme, which is one of printing schemes, using the inkjet apparatus 100 as shown in FIG. 10, for example.

In this way, with the processes shown in FIGS. 4 to 9, a multi-layer wiring substrate according to the Embodiment 2 shown in FIG. 2 is manufactured. Moreover, more specifically, if the process of forming the crystal grain 23 in the first conductive layer 22 is not provided, the multi-layer wiring substrate according to the Embodiment 1 may similarly be manufactured. Furthermore, if the process of forming the insulating layer 31 and the process of modifying the insulating layer 31 before the process of forming the first conductive layer are provided, the multi-layer wiring substrate according to the Embodiment 3 may also be manufactured in a similar manner.

As described above, according to the multi-layer wiring substrate manufacturing method according to the present embodiment, a multi-layer wiring substrate may be provided, wherein fine lower and upper wiring layers with superior shape control properties are electrically connected via a fine contact hole.

(Embodiment 5)

Figure 11:
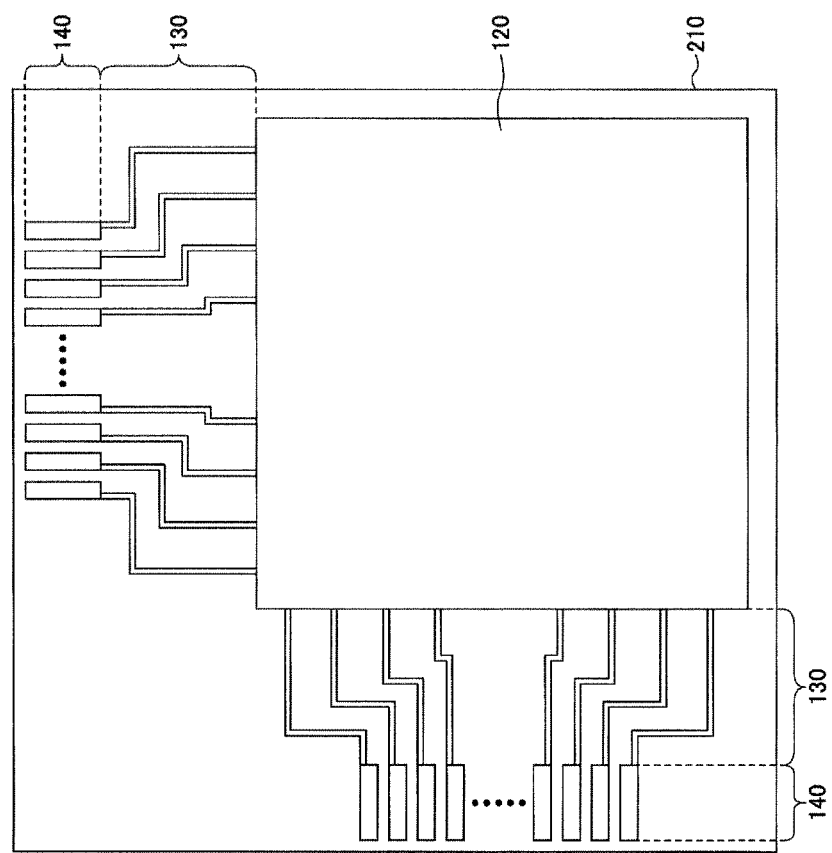
FIG. 11 is a diagram showing an example of an active matrix substrate according to an Embodiment 5 of the present invention.

FIG. 11 is a diagram illustrating an example of an active matrix substrate according to an Embodiment 5 of the present invention. In the Embodiment 5, a description is given of an embodiment, wherein the multi-layer wiring board, which is described in the Embodiments 1-3, is applied to an active matrix substrate.

In FIG. 11, the active matrix substrate according to the Embodiment 5 includes a substrate 210, a pixel circuit 120, a wiring 130, and an electrode pad 140.

The pixel circuit 120, which is a circuit for driving each element of the display element, is formed on the substrate 11. For the display element, various elements for performing image displaying may be used; for example, an organic light emitting element, a crystal element, etc., may be used.

The wiring 130 is a wiring connected to the pixel circuit 120. Moreover, the electrode pad 140, which is a terminal connected to the wiring 130, may be provided as needed for an external connection, etc. Furthermore, while not illustrated in FIG. 11, the wiring 130 or the electrode pad 140 is connected to the driving circuit in order to supply a signal or power to the pixel circuit.

Figure 12A:
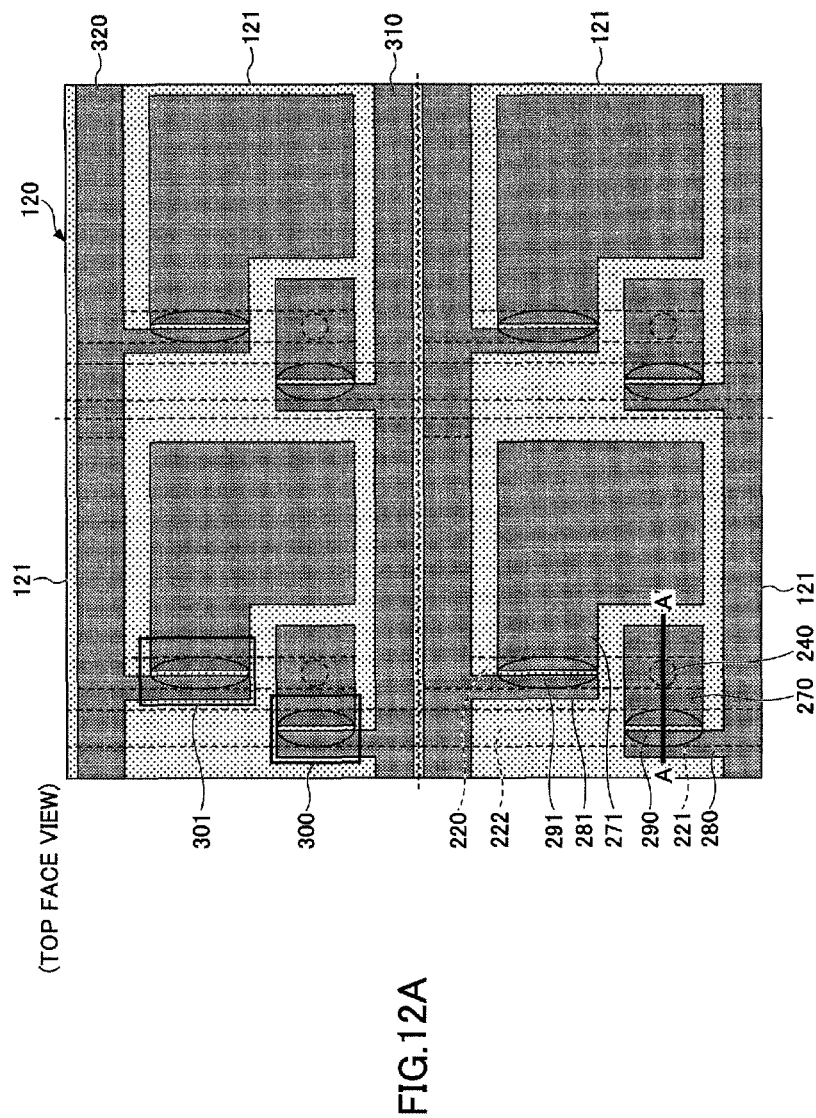
FIGS. 12A and 12B are views illustrating an exemplary pixel circuit, with FIG. 12A being a top face view of the exemplary pixel circuit and FIG. 12B being a cross-sectional view of the exemplary pixel circuit.
Figure 12B:
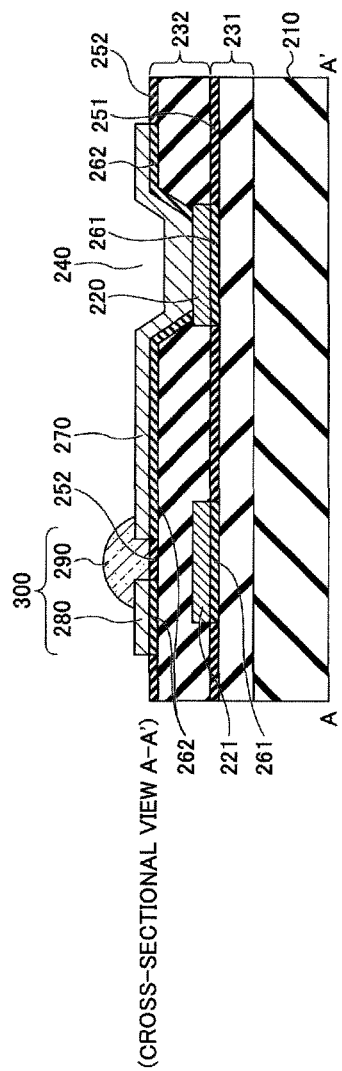

FIGS. 12A and 12B are views of illustrating an exemplary pixel circuit, with FIG. 12A being a top face view of the exemplary pixel circuit and FIG. 12B being a cross-sectional view of the exemplary pixel circuit. FIG. 12B, which is a cross-sectional view along a line A-A in FIG. 12A, shows a portion of a switching transistor which is included in the pixel circuit.

In FIG. 12A, a pixel circuit 120 including what corresponds to four pixels is shown. A pixel circuit 121 for each one pixel is equal from a configuration point of view, so that an explanation is given with the same reference letters for the same element of the respective pixel circuits 121. For the respective pixel circuit 121, a pixel circuit is shown as an example, which pixel circuit is used for driving an organic EL (electroluminescence) element.

In FIG. 12A, the pixel circuit 121 according to the present embodiment includes a switching transistor 300, a driving transistor 301, a gate signal line 222, a source signal line 310, and a feeder line 320.

Moreover, in FIG. 12B, the switching transistor 300 is a laminated structural body in which are successively laminated, on the substrate 210, an insulating layer 231; a gate electrode 221; a gate insulating layer 232, which is an interlayer insulating layer; a source electrode 280; a drain electrode 270; and a semiconductor layer 290. Moreover, while a direct cross-sectional configuration is not shown in FIG. 12B, the driving transistor 301, which has almost the same configuration as the switching transistor 300, is a laminated structural body in which are successively laminated, on the substrate 210, an insulating layer 231; a gate electrode 220; a gate insulating layer 232, which is an interlayer insulating layer; a source electrode 281; a drain electrode 271; and a semiconductor layer 291. In a part of the gate insulating layer 232 is formed a contact hole 240, having a structure such that the source electrode 280 of the switching transistor 300 and the gate electrode 220 of the driving transistor 301 are electrically connected.

Described in further detail, on the substrate 210 is formed an insulating layer 231, on the vicinity of whose surface the high surface energy region 261 and the low surface energy region 251 are formed. On the high surface energy region 261 of the insulating layer 231 is formed a gate electrode 220 of the driving transistor and a gate electrode 221 of the switching transistor 330, which is a conductive layer. Moreover, a gate insulating layer 232, which is an interlayer laminating layer, is laminated on the insulating layer 231 such that it covers a gate electrode 221 of the switching transistor 300 and a gate electrode 220 of the driving transistor 301.

In the vicinity of the surface of the gate insulating layer 232, which is an interlayer insulating layer, is formed a high surface energy region 262 and a low surface energy region 252. Moreover, on the high surface energy region 262 is formed the drain electrodes 270 and 271 and the source electrodes 280 and 281, which are conductive layers. A gap is provided between the drain electrode 270 and the source electrode 280 of the switching transistor and between the drain electrode 271 and the source electrode 281 of the driving transistor, and the semiconductor layers 290 and 291 are formed to fill these gaps.

The gate signal line 222 of the switching transistor 300, which is a conductive layer, extends in one direction from the gate electrode 221. The feeding line 320 and the source signal line 310, a conductive layer, are extended in a generally orthogonal direction relative to the extending direction of the gate signal line 222. The gate signal line 222 is formed on the high surface energy region 261 of the insulating layer 231. Moreover, the source signal line 310 and the feeding line 320 are formed on the high surface energy region 262 of the gate insulating layer 232.

In the pixel circuit 121 according to the present embodiment, as the conductive layer thereof, the gate electrode 221, the source electrode 280, and the drain electrode 270 of the switching transistor; the gate electrode 220, the source electrode 281, and the drain electrode 271 of the driving transistor; the gate signal line 222; the source signal line 310; and the feeding line 320 are all formed on the high surface energy regions 260, 261 provided in the vicinity of the vicinity of the surface of the gate insulating layer 232 and the insulating layer 231 containing a wetting property changing material. Not of all of these are necessary to be formed on the high surface energy regions 261 and 262 provided in the vicinity of the surface of the insulating layer containing the wetting property changing material. Moreover, in the present embodiment, while a configuration is shown of the gate electrode layers 220 and 221 located in a lower layer of the drain electrode layers 270 and 271 and the source electrode layers 280 and 281, the configuration is not limited thereto. The predetermined advantages of the present embodiment are obtained in any layer configuration as long as the electric circuit is similar.

As described above, according to the present embodiment, an active matrix substrate may be provided, wherein the fine lower wiring layer 220 and upper wiring layer 270 with superior shape control properties are electrically connected via the fine contact hole 240.

Moreover, an active matrix substrate and an image display element according to the present embodiment may be used to realize an image display apparatus. As the image display element, a liquid crystal display element, an electrophoretic display element, an organic EL display element, an electrochromic display element, etc., can be used.

Next, various examples are described, wherein a multi-layer wiring substrate is actually manufactured using the multi-layer wiring substrate and the manufacturing method thereof according to the present embodiments. In Examples 1-3, the multi-layer wiring substrates of the same configuration that have sizes of the contact hole varying in accordance with changing laser light energy conditions of laser light are manufactured, which are compared to make an evaluation.

EXAMPLE 1

FIG. 13 is a set of views illustrating an exemplary multi-layer wiring substrate according to an Example 1 of the present invention, with (A) being a cross-sectional view of the exemplary multi-layer wiring substrate according to the Embodiment 1 and (B) being a top face view of the exemplary multi-layer wiring substrate according to the Example 1.

In (A) and (B) in FIG. 13, the multi-layer wiring substrate according to the Example 1 includes a substrate 410; an insulating layer 431, which is formed on the insulating layer 410; a first conductive layer 420; an interlayer insulating layer 432, which is formed on the first conductive layer 420; and a second conductive layer 470, which is laminated on the interlayer insulating layer 432. Moreover, the multi-layer wiring substrate according to the Example 1 includes a structure, wherein the first conductive layer 420 and the second conductive layer 470 are electrically connected via the contact hole 440, which is formed in the interlayer insulating layer 432 such that a part of the first conductive layer 420 exposes. The interlayer insulating layer 432, which includes a material whose surface energy is changed by receiving energy, is divided into regions with differing surface energies, which regions include a low surface energy region 452; and a high surface energy region 462 of the interlayer insulating layer 432 whose surface energy is higher than that of the low surface energy region 452 and which includes at least the side face of the contact hole 440. Then, the second conductive layer 470 is connected with the first conductive layer 420 via a contact hole 440 while being in contact with the high surface energy region 462 of the interlayer insulating layer 432 along the high surface energy region 462.

As shown in (A) and (B) in FIG. 13, the first conductive layer 420 and the second conductive layer 470 make up a contact hole chain pattern (a daisy chain pattern), wherein the first conductive layer 420 and the second conductive layer 470 are connected via 960 contact holes 440. In (A) and (B) in FIG. 13, a part thereof is schematically illustrated.

Next, a multi-layer wiring substrate manufacturing method according to the Example 1 is described.

First, an NMP (N-Methyl-2-Pyrrolidone) solution, which contains a wetting property changing material, is spin coat applied onto a glass substrate. For the wetting property changing material, a polyimide material is used. Next, after pre-baking in a 100° C. oven, a thermal processing is applied in a 300° C. oven to form the insulating layer 431.

Next, a photomask having an opening pattern with a pattern width of 60 μm is manufactured and ultra violet rays with a wavelength of no more than 300 nm (an extra high pressure mercury lamp) are exposed onto a part of the insulating layer 431, forming, on the insulating layer 431, a pattern including the high surface energy region 461 and the low surface energy region 451.

Next, a functional liquid including hydrophilic ink containing Ag nanoparticles is selectively dropped onto the high surface energy region 461 with an inkjet method. The functional liquid has a surface tension of approximately 30 mN/m; a viscosity is 10 mPa·s; a contact angle relative to the high surface energy region 461 of the functional liquid measured using a drop method is approximately 5°, while a contact angle relative to the low surface energy region is approximately 30°. An inkjet head of a piezoelectric scheme with the number of nozzles of 100 is used and a drive voltage is adjusted to drop the functional liquid with an average volume of the functional liquid ejected from a liquid droplet ejecting nozzle of approximately 8 pl (picoliters) (the diameter at the time of flying of approximately 25 μm). At this time, an interval between the substrate 410 and the liquid droplet ejecting nozzle is set to be 0.5 mm, with an impact position variation among all 100 nozzles being ±15 μm.

Next, the functional liquid is dried and solidified in a 100° C. oven to form the first conductive layer 420 with a thickness of approximately 400 nanometers and a pattern width of 60 micrometers.

Next, the NMP solution containing the wetting property changing material is spin coat applied onto the glass substrate 410. For the wetting property changing material, a material including a polyimide material shown in a general color (1) below is used. Next, after pre-baking in a 100° C. oven, a thermal processing is applied in a 300° C. oven to form an interlayer insulating layer 432 with a thickness of approximately 500 nm.

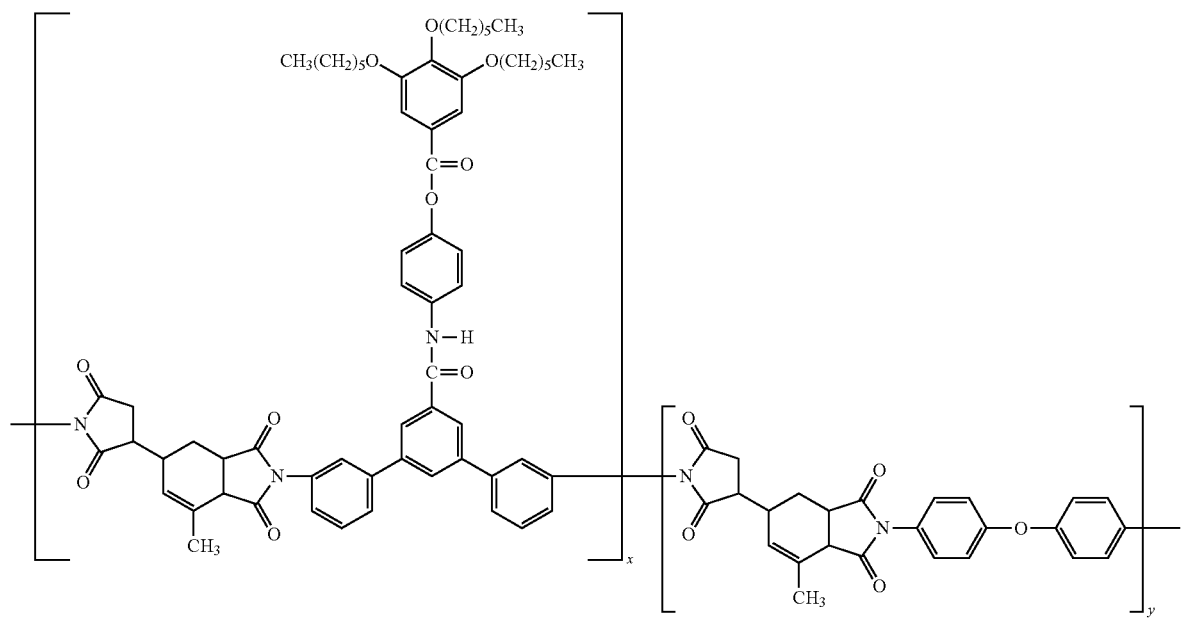

(1)

Next, the contact hole 440 is produced with a laser processing apparatus which is equipped with an excimer laser, which is a gas laser. A wavelength of a laser light is 248 nm. The laser light is beam shaped with a metal opening mask and is collimated with an objective lens to irradiate over the interlayer insulating layer 432, forming the contact hole 440. An energy density of the laser light at the processing face is 60 mJ/cm$^2$. The processing conditions are adjusted such that the contact hole diameter becomes 20 μm.

Next, a photomask having an opening pattern with a pattern width of 60 μm is manufactured, ultraviolet rays with a wavelength of no more than 300 nm (an extra high-pressure mercury lamp) are exposed onto a part of the interlayer insulating layer 432, and a pattern is formed on the interlayer insulating layer 432, which pattern includes a low surface energy region 452, and a high surface energy region 42 of the interlayer insulating layer 432 that has a surface energy higher than that of the low surface energy region 452 and that includes at least a side face of the contact hole 440.

Next, a functional liquid including hydrophilic ink containing Ag nanoparticles is selectively dropped onto the high surface energy region 462 with an inkjet method. The function liquid, the liquid droplet volume, and inkjet conditions are the same as those for forming the first conductive layer 420.

Next, the functional liquid is dried and solidified in a 100° C. oven to form the second conductive layer 470. In this way, the multi-layer wiring substrate according to the example 1 shown in FIG. 13 can be obtained.

EXAMPLE 2

Example 2 is an example related to the multi-layer wiring substrate manufacturing method shown in FIG. 13 in a manner similar to Example 1. Other than that the contact hole diameter is set to 10 μm, the multi-layer wiring substrate is manufactured with the same method as the Example 1.

EXAMPLE 3

Example 3 is an example related to the multi-layer wiring substrate manufacturing method shown in FIG. 13 in a manner similar to the Example 1. Other than that the laser light energy density in the processing face is set to 100 mJ/cm$^2$, the multi-layer wiring substrate is manufactured in a method similar to the Example 1.

Table 1 is a table collectively showing manufacturing conditions and evaluation results of the multi-layer wiring substrate in Examples 1-3. As shown in the Examples 1-3 in Table 1, the diameter of the contact hole 440 takes fine values of 10 μm and 20 μm, while the contact hole resistance takes a low resistance of no more than 0.15Ω. According to the present examples, under various conditions, a multi-layer substrate may be manufactured, wherein fine upper and lower wiring layers with superior shape control properties are electrically connected via a fine contact hole.

Moreover, as shown in the Example 3, laser light irradiating energy can be increased to increase a surface roughness of the first conductive layer 80 to decrease a contact hole resistance.

TABLE 1

| | PATTERN WIDTH OF FIRST CONDUCTIVE LAYER 80 [μm] | PATTERN WIDTH OF SECOND CONDUCTIVE LAYER 70 [μm] | CONTACT HOLE DIAMETER [μm] | LASER LIGHT ENERGY DENSITY [J/cm$^2$] | FUNCTIONAL LIQUID TOTAL VOLUME USED IN FORMING SECOND CONDUCTIVE LAYER 70 [pL] | CONTACT HOLE REISTANCE [Ω] | SURFACE ROUGHNESS OF CONDUCTIVE LAYER 80 | |
|---|---|---|---|---|---|---|---|---|
| | | | | | | | VICINITY OF CENTER OF OPENING [nm] | VICINITY OF END OF OPENING [nm] |
| EXAMPLE 1 | 60 | 60 | 20 | 60 | 50 | 0.08 | 20 | 20 |
| EXAMPLE 2 | 60 | 60 | 10 | 60 | 50 | 0.15 | 20 | 20 |
| EXAMPLE 3 | 60 | 60 | 20 | 100 | 50 | 0.05 | 110 | 40 |

Figure 14A:
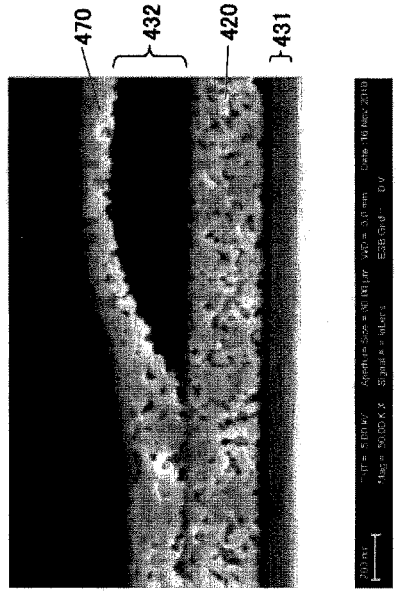
FIGS. 14A and 14B are views illustrating an electroscopic image of the multi-layer wiring substrate according to an Example 1, with FIG. 14A being a top face electroscopic image of the multi-layer wiring substrate according to the Example 1 and FIG. 14B being a cross-sectional view of the multi-layer wiring substrate according to the Example 1.
Figure 14B:

FIGS. 14A and 14B are views illustrating an electroscopic image of the multi-layer wiring substrate according to the Example 1, with FIG. 14A showing a top face electroscopic view of the multi-layer wiring substrate according to the Example 1 and FIG. 14B being a cross-sectional electroscopic view of the multi-layer wiring substrate according to the Example 1. From FIGS. 14A and 14B, it is seen that, according to the present example, a contact hole 440 with a forward tapered shape can be formed, and a film thickness of the second conductive layer 470 in a central portion of the contact hole can be made larger than a film thickness of the second conductive layer 470 on a contact hole side face.

EXAMPLE 4

Example 4 is an example related to the pixel circuit 120 of the active matrix substrate according to the Embodiment 5, which was shown in FIG. 12. In the pixel circuit 120 with a resolution of 150 ppi, a switching transistor 300 and a driving transistor 301 are formed in a region with four sides of approximately 169 μm. Below, a method of manufacturing an active matrix substrate 120 is described, conditions for inkjet, liquid droplet volume, functional liquid, and polyimide material are set the same as the Example 1, so that repeated explanations are omitted. For the reference letters, the same ones as those of the Embodiment 5 are to be used.

First, the NMP solution containing the wetting property changing material is spin coat applied onto the glass substrate 210. Next, after pre-baking in a 100° C. oven, a thermal processing is applied in a 300° C. oven to form an insulating layer 231.

Next, a photo mask having a predetermined opening pattern is manufactured and ultra violet rays with a wavelength of no more than 300 nm an extra high pressure mercury lamp) are exposed onto a part of the insulating layer 231, forming, on the insulating layer 231, a pattern including the high surface energy region 261 and the low surface energy region 251.

Next, a functional liquid including hydrophilic ink containing Ag nanoparticles is selectively dropped onto the high surface energy region 261 by an inkjet method, and then the functional liquid is dried and solidified in a 100° C. oven to form the gate electrode 221 of the switching transistor 300, the gate electrode 220 of the driving transistor 301, and the gate signal line 222.

Next, the NMP solution containing a polyimide material is applied on the insulating layer 231 by spin coating, and pre-baking is performed in a 100° C., and then a thermal processing is applied in a 300° C. to form a gate insulating layer 232 with a film thickness of approximately 500 nm.

Next, the contact hole 240 is produced with a laser processing apparatus which is equipped with an excimer laser, which is a gas laser. A wavelength of the laser light is 248 nm. The laser light is beam shaped with a metal opening mask and is collimated with an objective lens to irradiate over the interlayer insulating layer 232, forming the contact hole 240. A laser light energy density at the processing face is 60 mJ/cm². The contact hole diameter is set to 20 µm.

Thereafter, a photomask having a predetermined opening pattern is used to expose ultraviolet rays onto a part of the gate insulating layer 232, and a pattern which includes the high surface energy region 262 and the low surface energy region 252 is formed on the gate insulating layer 232.

Next, a functional liquid including hydrophilic ink containing Ag nanoparticles is selectively dropped in the periphery of the contact hole 240, and then is dried and solidified in a 100° C. oven to form a source electrode 280 and a drain electrode 270 of the switching transistor 300; a source electrode 281 and a drain electrode 271 of the driving transistor 301; a source signal line 310; and a feeding line 320.

Next, semiconductor layers 290 and 291 are formed by applying with an inkjet method, a solution in which a polymer, which is an organic semiconductor synthesized by a scheme shown in a general formula (2), is dissolved into toluene and an active matrix substrate according to example 4 is manufactured.

The diameter of the contact hole 240 is 20 µm in example 4 as well, making it possible to connect an upper layer drain electrode 270 and a gate electrode using the fine contact hole 240 and to manufacture an active matrix substrate.

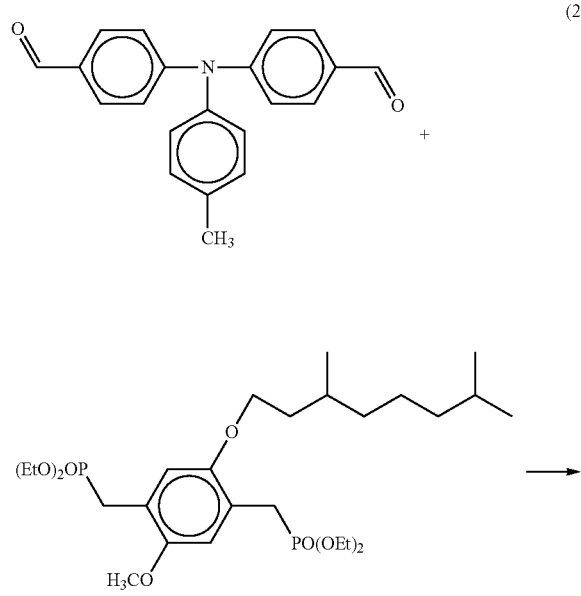

(2)

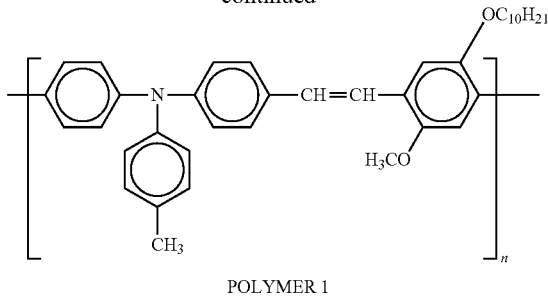

POLYMER 1

EXAMPLE 5

In Example 5, an electro-chromic display element is affixed to the active matrix substrate manufactured in the Example 4 to manufacture a display apparatus. Operating the manufactured display apparatus makes it possible to display an image with a high contrast. Moreover, 150 ppi and a high definition active matrix substrate may be used to clearly display a 10 pt letter.

In this way, according to the Examples 1 to 5, fine upper and lower wiring layers with superior shape control properties may be electrically connected via a fine contact hole, making it possible to apply them to the multi-layer wiring substrate, the active matrix substrate, and the image display apparatus using the same, respectively.

While preferred embodiments and examples of the present invention have been described in detail, the present invention is not limited to the above described embodiments and examples, so that variations and replacements may be applied to the above described examples without departing from the scope of the present invention.

The present invention may be applied to multi-layer wiring substrates in which upper and lower wiring layers are electrically connected using a contact hole, and electronic equipment units in general that use the same; for example, it may be applied to active matrix substrates, and image display apparatuses which use the same.

The present application is based on Japanese Priority Application No. 2011-203294 filed on Sep. 16, 2011, the entire contents of which are hereby incorporated by reference.

The invention claimed is:

1. A multiple-layer wiring substrate having a first conductive layer formed on the substrate; an interlayer insulating layer formed on the first conductive layer; and a second conductive layer formed on the interlayer insulating layer, and having a structure in which the first conductive layer and the second conductive layer arc electrically connected via a contact hole formed in the interlayer insulating layer, wherein
the interlayer insulating layer includes a material whose surface energy is changed by receiving energy, and has a first region which does not include the contact hole and a second region which is formed such that its surface energy is higher than that of the first region, wherein
a region within the contact hole of the first conductive layer has surface energy which is higher than surface energy of the second region of the interlayer insulating layer, and wherein
the second conductive layer is formed by laminating, wherein the second conductive layer is in contact with the second region of the interlayer insulating layer along the second region, and is connected to the first conductive layer via the contact hole, wherein the first conductive layer has multiple crystal grains in a region within the contact hole, and wherein at least one of surface roughness and grain diameter is larger in a central portion within the contact hole of the first conductive layer than in the vicinity of an end of the contact hole.

2. The multi-layer wiring substrate as claimed in claim 1, wherein the first region is formed as a hydrophobic region and, wherein the second region is formed as a hydrophilic region.

3. The multi-layer wiring substrate as claimed in claim 1, wherein the second conductive layer is a conductive layer which is formed by a functional liquid including a conductive material supplied by a printing scheme being dried and solidified.

4. The multi-layer wiring substrate as claimed in claim 1, wherein an inside face of the contact hole has a tapered shape.

5. The multi-layer wiring substrate as claimed in claim 1, wherein a film thickness of the second conductive layer which is formed on a central portion of the contact hole is larger than the film thickness of the second conductive layer which is formed on an inside face of the contact hole.

6. The multi-layer wiring substrate as claimed in claim 1, wherein the first conductive layer is formed on an insulating layer on the substrate, and wherein the insulating layer includes a material whose surface energy is changed by receiving energy, and a low surface energy region and a high surface energy region are formed by the receiving of energy, and wherein the first conductive layer is formed on the high surface energy region which is selectively formed in the insulating layer.

7. An active matrix substrate, comprising the multi-layer wiring substrate as claimed in claim 1, wherein the first conductive layer is arranged as a gate electrode, wherein the interlayer insulating layer is arranged as a gate insulating layer, wherein the active matrix substrate further includes a source electrode and a drain electrode which are formed in the same layer as the second conductive layer, and a semiconductor layer which is formed such that it overlaps both the source electrode and the drain electrode.

8. An image display apparatus, comprising:

the active matrix substrate as claimed in claim 7; and a display device which is driven by the active matrix substrate.

9. A multi-layer wiring substrate manufacturing method, comprising the steps of:

forming a first conductive layer on a substrate;

forming, on the first conductive layer, an interlayer insulating layer using a material which includes a material whose surface energy is changed by receiving energy;

forming a contact hole in the interlayer insulating layer such that a part of the first conductive layer exposes;

applying energy to the interlayer insulating layer to form a first region which does not include the contact hole and a second region which includes the contact hole and whose surface energy is higher than that of the first region; and forming a second conductive layer such that it comes in continuous contact with the first conductive layer and the second region of the interlayer insulating film along the first conductive layer and the second region, wherein forming the contact hole includes removing the interlayer insulating layer of a laser light irradiated portion by irradiating a laser light to form the contact hole, and wherein the laser light has higher energy at a central portion thereof relative to an end portion, the laser light is irradiated onto the first conductive layer even after the interlayer insulating film is removed, and processing is performed such that a surface roughness or a grain diameter at a central portion of a region within the contact hole of the first conductive layer becomes larger relative to that in the vicinity of an end portion thereof.

10. The multi-layer wiring substrate manufacturing method as claimed in claim 9, wherein the first region is formed as a hydrophobic region and, wherein the second region is formed as a hydrophilic region.

11. The multi-layer wiring substrate manufacturing method as claimed in claim 9, wherein forming the second conductive layer includes using an inkjet method to provide to the contact hole and dry a functional liquid including a conductive material to form the second conductive layer.

12. The multi-layer wiring substrate manufacturing method as claimed in claim 9, wherein the applying of the energy is conducted by irradiating ultraviolet rays, and wherein the ultraviolet rays are irradiated while the second region is exposed and the first region is covered with a photomask to form the second region whose surface energy is higher relative to the first region.

* * * * *